United States Patent
Yu et al.

(10) Patent No.: US 12,532,760 B2
(45) Date of Patent: Jan. 20, 2026

(54) CHIP PACKAGE UNIT, METHOD OF MANUFACTURING THE SAME, AND PACKAGE STRUCTURE FORMED BY STACKING THE SAME

(71) Applicant: WALTON ADVANCED ENGINEERING, INC., Kaohsiung (TW)

(72) Inventors: Hong-Chi Yu, Kaohsiung (TW); Chun-Jung Lin, Kaohsiung (TW); Ruei-Ting Gu, Kaohsiung (TW)

(73) Assignee: WALTON ADVANCED ENGINEERING, INC., Kaohsiung (TW)

( * ) Notice: Subject to any disclaimer, the term of this patent is extended or adjusted under 35 U.S.C. 154(b) by 378 days.

(21) Appl. No.: 18/220,272

(22) Filed: Jul. 11, 2023

(65) Prior Publication Data

US 2024/0030124 A1 Jan. 25, 2024

(30) Foreign Application Priority Data

Jul. 25, 2022 (TW) ................................. 111127750

(51) Int. Cl.
*H01L 23/498* (2006.01)
*H01L 23/00* (2006.01)
(Continued)

(52) U.S. Cl.
CPC ...... *H01L 23/4985* (2013.01); *H01L 23/3171* (2013.01); *H01L 24/05* (2013.01); *H01L 24/08* (2013.01); *H01L 25/0657* (2013.01); *H01L 2224/05026* (2013.01); *H01L 2224/05073* (2013.01); *H01L 2224/05571* (2013.01);
(Continued)

(58) Field of Classification Search
CPC ............ H01L 23/4985; H01L 25/0657; H01L 25/105; H01L 2224/05026; H01L 2224/05571; H01L 2225/107; H01L 2225/06572; H01L 2225/1035;
(Continued)

(56) References Cited

U.S. PATENT DOCUMENTS

| | | | |
|---|---|---|---|
| 2004/0021211 A1* | 2/2004 | Damberg | ............ H01L 23/5385 257/E25.011 |
| 2005/0057911 A1* | 3/2005 | Rapport | ................ H01L 25/105 257/E25.023 |

(Continued)

*Primary Examiner* — Didarul A Mazumder
(74) *Attorney, Agent, or Firm* — Fei-hung Yang

(57) ABSTRACT

A chip package unit, a method of manufacturing the same, and package structure formed by stacking the same are provided. At least one first connecting pad, at least one second connecting pad, and at least one third connecting pad of a flexible printed circuit (FPC) board in the chip package unit are electrically connected with one another by circuit of the FPC board. At least one die pad disposed on a front surface of a chip is electrically connected with the first connecting pad first and then electrically connected with the outside by the second connecting pad or the third connecting pad. Thereby the chip of the chip package unit can be electrically connected with the outside by the front surface or a back surface thereof. Therefore, not only production is reduced due to simplified production process and energy saved, volume of the package structure is also reduced.

6 Claims, 4 Drawing Sheets

(51) Int. Cl.
*H01L 23/31* (2006.01)
*H01L 25/065* (2023.01)

(52) U.S. Cl.
CPC ............... *H01L 2224/05573* (2013.01); *H01L 2224/08238* (2013.01); *H01L 2225/06572* (2013.01)

(58) Field of Classification Search
CPC ............ H01L 23/3121; H01L 23/3171; H01L 2224/08238; H05K 1/189; H05K 1/181
USPC ........................................................ 257/773
See application file for complete search history.

(56) References Cited

U.S. PATENT DOCUMENTS

| | | | | |
|---|---|---|---|---|
| 2008/0232047 | A1* | 9/2008 | Yamada | G02F 1/13452 361/679.02 |
| 2011/0233783 | A1* | 9/2011 | Lim | H01L 23/5387 257/762 |
| 2016/0295700 | A1* | 10/2016 | Yu | H01L 25/50 |
| 2019/0384088 | A1* | 12/2019 | Jung | G02F 1/13452 |
| 2020/0144712 | A1* | 5/2020 | Wu | H04M 1/03 |
| 2021/0011530 | A1* | 1/2021 | Shin | G02F 1/13452 |

\* cited by examiner

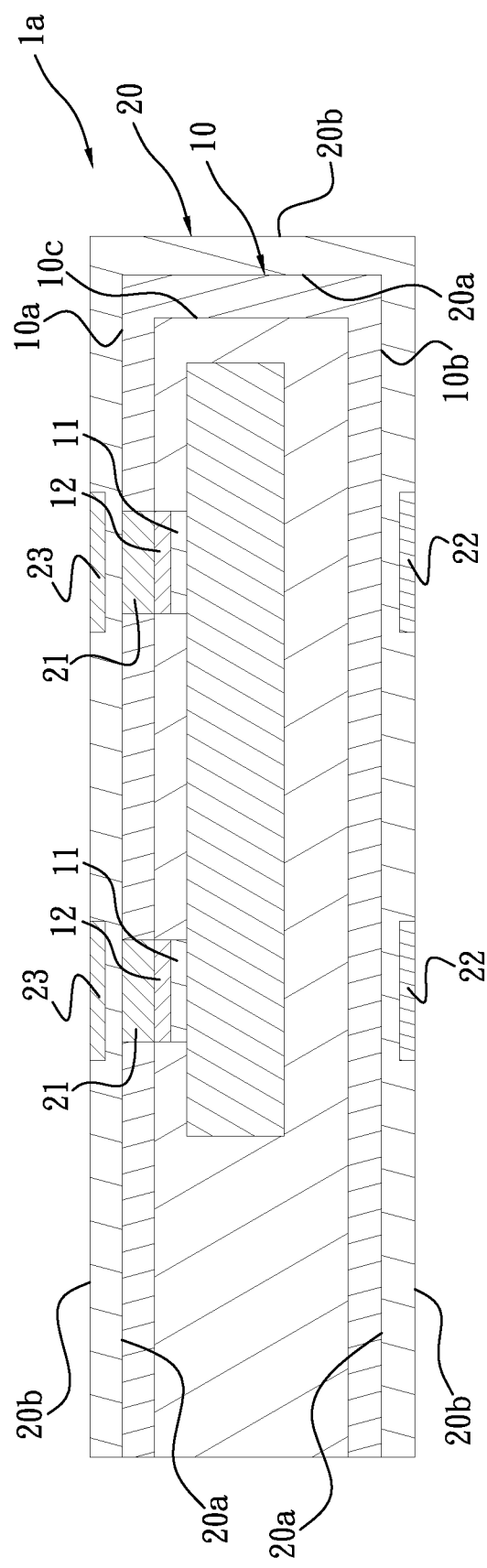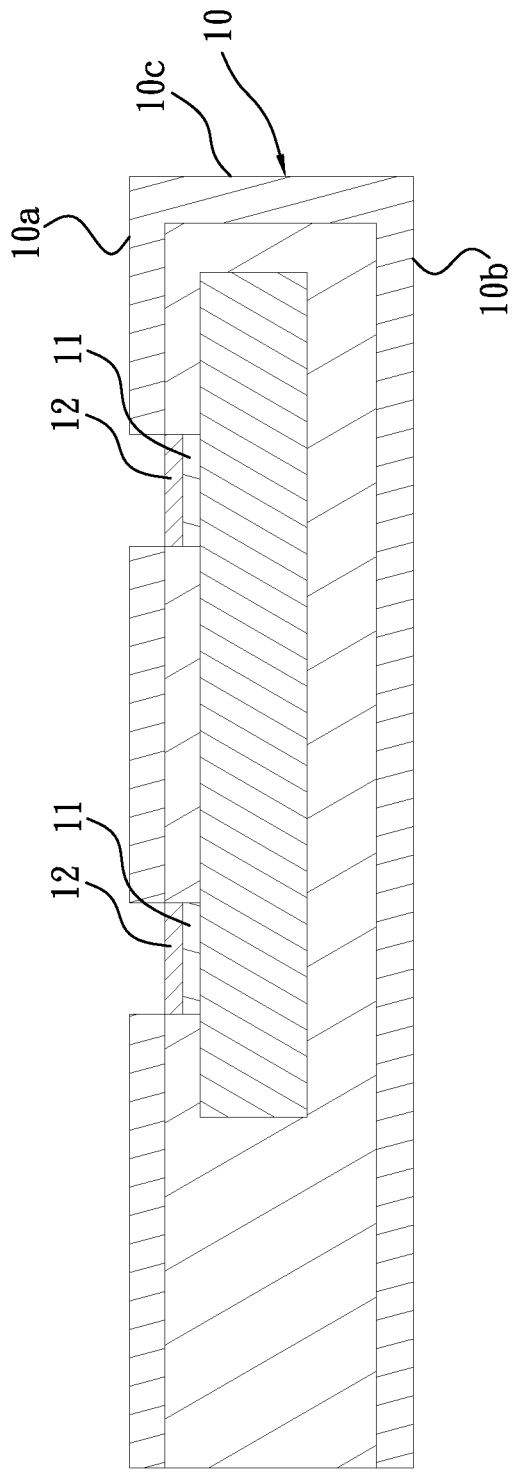
FIG. 1
FIG. 2

CHIP PACKAGE UNIT, METHOD OF MANUFACTURING THE SAME, AND PACKAGE STRUCTURE FORMED BY STACKING THE SAME

CROSS-REFERENCE TO RELATED APPLICATIONS

This non-provisional application claims priority under 35 U.S.C. § 119(a) on Patent Application No(s). 111127750 filed in Taiwan, R.O.C. on Jul. 25, 2022, the entire contents of which are hereby incorporated by reference.

BACKGROUND OF THE INVENTION

The present invention relates to a chip package unit, a method of manufacturing the same, and package structure formed by stacking the same, especially to a chip package unit which includes a bent flexible printed circuit (FPC) board having a C-shaped section for clipping a front surface, a side surface, and a back surface of a chip therein and allowing die pads arranged at the front surface and the back surface of the chip to be electrically connected with the outside by the FPC board, a method of manufacturing the same, and package structure formed by stacking the same.

In a conventional chip package, a through silicon via (TSV) is a vertical electrical connection (via) that passes through a chip (or die) from a front surface to a back surface completely. Thereby the front surface or the back surface of the chip package can be electrically connected with the outside. However, a formation process of the TSV is labor and time consuming. The TSV also increases difficulty in internal circuit design of the chip. For example, the design of the internal circuit in the chip needs to avoid positions of the TSV so that manufacturing cost of the chip package is increased.

SUMMARY OF THE INVENTION

Therefore, it is a primary object of the present invention to provide a chip package unit, a method of manufacturing the same, and package structure formed by stacking the same. At least one first connecting pad, at least one second connecting pad, and at least one third connecting pad of a flexible printed circuit (FPC) board in the chip package unit are electrically connected with one another by circuit of the FPC board. At least one die pad disposed on a front surface of a chip is electrically connected with the first connecting pad of the FPC board first and then electrically connected with the outside by the second connecting pad or the third connecting pad of the FPC board. Thereby the chip of the chip package unit can be electrically connected with the outside by the front surface or a back surface thereof and the problem of increased manufacturing cost of conventional chip package caused by design of the through silicon via (TSV) can be solved effectively.

In order to achieve the above object, a chip package unit of the present invention includes a chip and a flexible printed circuit (FPC) board. The chip consists of a front surface, a back surface, and a side surface. At least one die pad is disposed on the front surface and the back surface is opposite to the front surface while the side surface is located between the front surface and the back surface. The FPC is provided with a circuit therein and bent to have a C-shaped section which clips the chip therein. The FPC board is composed of a first surface and a second surface. The first surface is attached to the front surface, the side surface, and the back surface of the chip. The first surface is provided with at least one first connecting pad which is corresponding to and connected with the die pad of the chip so that the circuit of the FPC board is electrically connected with the respective die pads by the respective first connecting pads. The second surface is provided with at least one second connecting pad and at least one third connecting pad which are respectively corresponding to the back surface of the chip and the front surface of the chip. The first connecting pad, the second connecting pad, and the third connecting pad of the FPC board are electrically connected with one another by the circuit of the FPC board. The respective die pads on the front surface of the chip are electrically connected with the first connecting pads of the FPC board first and then further electrically connected with the outside by the respective second connecting pads or the respective third connecting pads of the FPC board.

A method of manufacturing chip package units according to the present invention includes the following steps. Step S1: providing a chip which includes a front surface provided with at least one die pad, a back surface, and a side surface. Step S2: providing a flexible printed circuit (FPC) board with circuit therein and having a first surface and a second surface. The first surface is provided with at least one first connecting pad connected with the die pad of the chip correspondingly while the second surface is provided with at least one second connecting pad and at least one third connecting pad. The first connecting pad, the second connecting pad, and the third connecting pad of the FPC board are electrically connected with one another by the circuit of the FPC board. Step S3: bending the FPC board to have a C-shaped section for clipping the chip therein. The first surface is attached to the front surface, the side surface, and the back surface of the chip while the circuit of the FPC board is electrically connected with the respective die pads of the chip by the respective first connecting pads. The respective second connecting pads are corresponding to the back surface of the chip and the respective third connecting pads are corresponding to the front surface of the chip. The respective die pads on the front surface of the chip are electrically connected with the first connecting pads of the FPC board first and then further electrically connected with the outside by the respective second connecting pads or the respective third connecting pads of the FPC board. Thereby a chip package unit has been produced.

A package structure formed by stacking chip package units according to the present invention is composed of at least two chip package units, at least one connecting circuit, and at least one insulating layer. The two chip package units are stacked vertically and having an upper chip package unit and a lower chip package unit. The connecting circuit is disposed between the upper and the lower chip package units and electrically connected with the respective second connecting pads of the upper chip package unit and the respective third connecting pads of the lower chip package unit. Thereby the upper chip package unit and the lower chip package unit are electrically connected by the connecting circuit. As to the insulating layer, it is not only covering the chip package unit and the connecting circuit but also filled into gaps of the package structure. The insulating layer includes at least one upper opening and at least one lower opening which are respectively used for allowing the third connecting pad of the uppermost chip package unit and the second connecting pad of the lowermost chip package unit of the respective chip package units to be exposed. The respective chip package units are electrically connected with the outside by the respective upper openings and the respective lower openings of the respective insulating layers. The design helps reduce volume of chip package products and cost at manufacturing end.

BRIEF DESCRIPTION OF THE DRAWINGS

FIG. 1 is a side view of a longitudinal section of a chip package unit according to the present invention;

FIG. 2 is a side view of a longitudinal section of a wafer according to the present invention;

DETAILED DESCRIPTION OF THE PREFERRED EMBODIMENT

Figure 4:
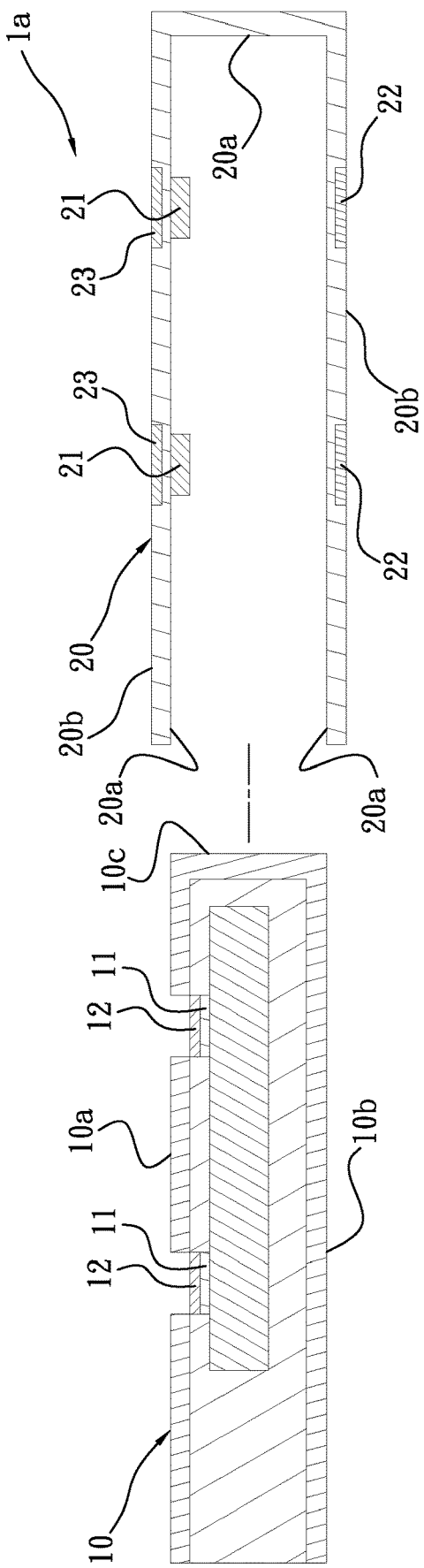
FIG. 4 is an exploded view of the embodiment in FIG. 1 according to the present invention.

Refer to FIG. 1 and FIG. 4, a chip package unit 1a of the present invention includes a chip 10 and a flexible printed circuit (FPC) board 20.

The chip 10 consists of a front surface 10a, a back surface 10b, and a side surface 10c. At least one die pad 11 is disposed on the front surface 10a and the back surface 10b is opposite to the front surface 10a while the side surface 10c is located between the front surface 10a and the back surface 10b. In the embodiment shown in FIG. 1, there are two die pads 11, but the number of the die pads 11 is not limited.

Figure 3:
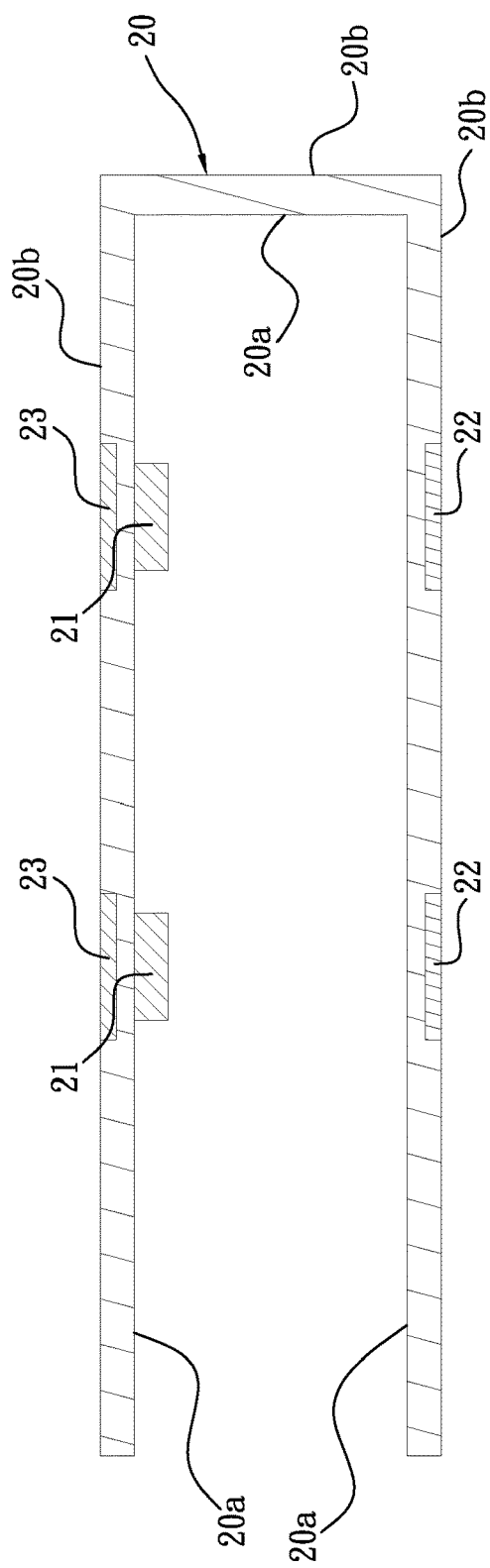
FIG. 3 is a side view of a longitudinal section of a flexible printed circuit board according to the present invention.

The FPC 20 which is provided with a pre-designed circuit therein is bent into a form having a C-shaped section to clip the chip 10 therein, as shown in FIG. 1. The FPC board 20 is composed of a first surface 20a and a second surface 20b opposite to the first surface 20a, as shown in FIG. 3. The first surface 20a is attached to the front surface 10a, the side surface 10c, and the back surface 10b of the chip 10, as shown in FIG. 1. The first surface 20a is provided with at least one first connecting pad 21 which is corresponding to the die pad 11 of the chip 10 so that the circuit of the FPC board 20 is electrically connected with the respective die pads 11 of the chip 10 by the respective first connecting pads 21, as shown in FIG. 1. The second surface 20b is provided with at least one second connecting pad 22 and at least one third connecting pad 23 which are respectively corresponding to the back surface 10b and the front surface 10a of the chip 10, as shown in FIG. 1. The first connecting pad 21, the second connecting pad 22, and the third connecting pad 23 of the FPC board 20 are electrically connected with one another by the circuit inside the FPC board 20. In the embodiment shown in FIG. 1, there are two first connecting pads 21, two second connecting pads 22, and two third connecting pads 23. But the number of the first connecting pad 21, the second connecting pad 22, and the third connecting pad 23 is not limited.

The respective die pads 11 on the front surface 10a of the chip 10 are electrically connected with the first connecting pads 21 of the FPC board first and then further electrically connected with the outside by the respective second connecting pads 22 or the respective third connecting pads 23 of the FPC board 20, as shown in FIG. 1.

As shown in FIG. 1, the chip package unit 1a further includes a protective layer 12 disposed between the respective die pads 11 and the respective first connecting pads 21.

Refer to FIG. 1-4, a method of manufacturing chip package units according to the present invention includes the following steps.

Step S1: providing a chip 10 which includes a front surface 10a provided with at least one die pad 11, a back surface 10b opposite to the front surface 10a, and a side surface 10c located between the front surface and the back surface 10b, as shown in FIG. 2.

Step S2: providing a flexible printed circuit (FPC) board 20 with a circuit therein and having a first surface 20a and a second surface 20b, as shown in FIG. 3. The first surface 20a is provided with at least one first connecting pad 21 which is corresponding to the die pad 11 of the chip 10, as shown in FIG. 1. The second surface 20b is provided with at least one second connecting pad 22 and at least one third connecting pad 23, as shown in FIG. 3. The first connecting pad 21, the second connecting pad 22, and the third connecting pad 23 of the FPC board 20 are electrically connected with one another by the circuit of the FPC board 20.

Step S3: bending the FPC board 20 to have a C-shaped section for clipping the chip 10 therein, as shown in FIG. 4. The first surface 20a is attached to the front surface 10a, the side surface 10c, and the back surface 10b of the chip 10 while the circuit of the FPC board 20 is electrically connected with the respective die pads 11 of the chip 10 by the respective first connecting pads 21, as shown in FIG. 1. The respective second connecting pads 22 are corresponding to the back surface 10b of the chip as shown in FIG. 1. The respective third connecting pads 23 are corresponding to the front surface 10a of the chip 10, as shown in FIG. 1. The respective die pads 11 on the front surface 10a of the chip 10 are electrically connected with the first connecting pads 21 of the FPC board first and then further electrically connected with the outside by the respective second connecting pads 22 or the respective third connecting pads 23 of the FPC board 20, as shown in FIG. 1. Thereby the chip package unit 1a has been produced.

Figure 5:
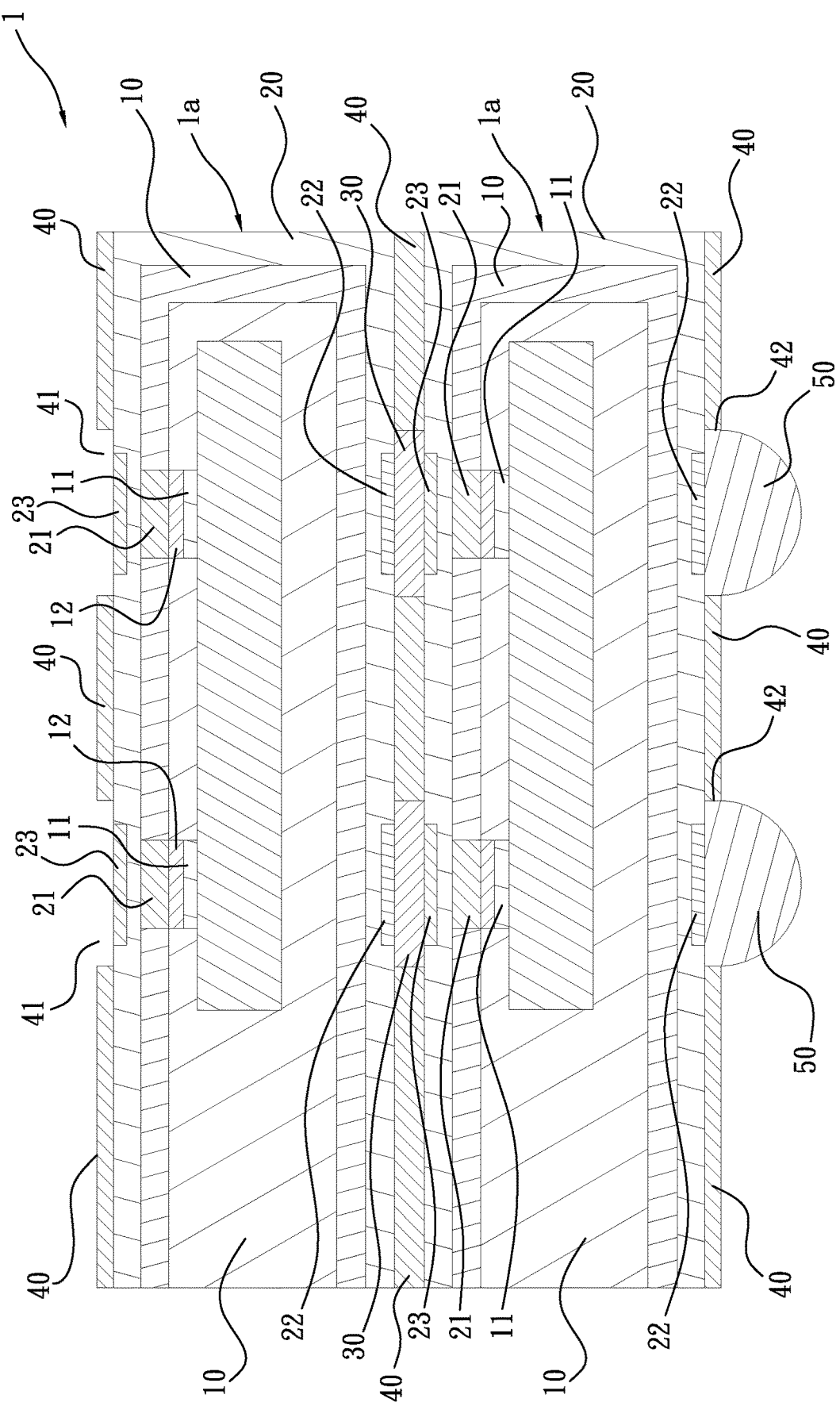
FIG. 5 is a side view of a longitudinal section of a package structure according to the present invention.
Figure 6:
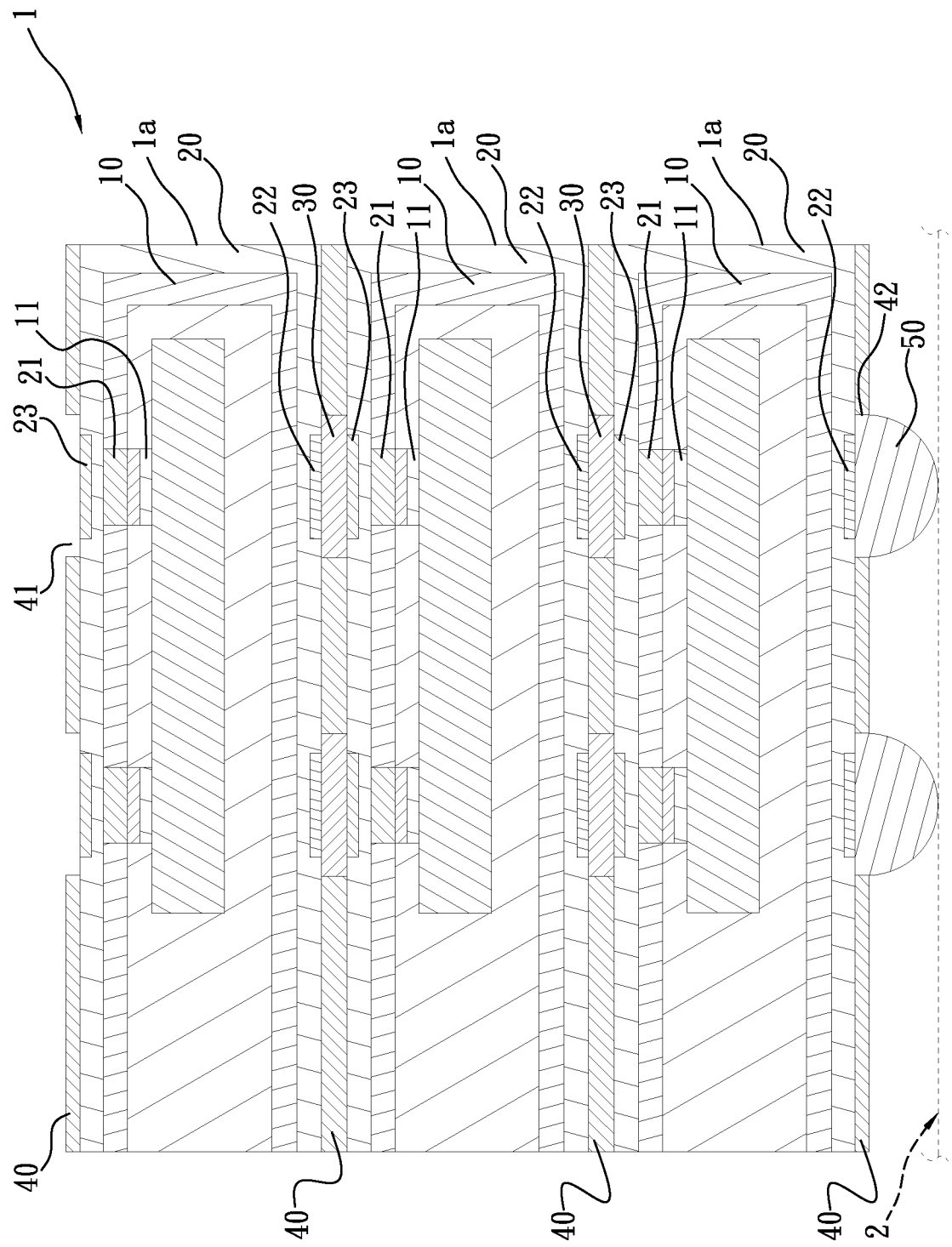
FIG. 6 is a side view of a longitudinal section of a package structure with three chip package units according to the present invention.

Refer to FIG. 5 and FIG. 6, a package structure 1 formed by stacking chip package units 1a according to the present invention is provided. The package structure 1 is composed of at least two chip package units 1a, at least one connecting circuit 30, and at least one insulating layer 40.

As shown in FIG. 5 and FIG. 6, the chip package units 1a are stacked vertically and having an upper chip package unit 1a and a lower chip package unit 1a. Refer to FIG. 6, there are three chip package units 1a in this embodiment but the number of the chip package unit 1a is not limited.

Refer to FIG. 5 and FIG. 6, the connecting circuit 30 which is arranged between the upper chip package unit 1a and the lower chip package unit 1a is electrically connected with the second connecting pads 22 of the upper chip package unit 1a and the third connecting pads 23 of the lower chip package unit 1a. Thereby the upper chip package unit 1a and the lower chip package unit 1a are electrically connected by the connecting circuit 30. In this embodiment shown in FIG. 6, there are three connecting circuit 30 but the number of the connecting circuit 30 is not limited.

As shown in FIG. 5 and FIG. 6, the insulating layer 40 is not only covering the chip package unit 1a and the connecting circuit 30 but also filled into gaps of the package structure 1. The insulating layer 40 includes at least one upper opening 41 and at least one lower opening 42 which are respectively used for allowing the third connecting pad 23 of the uppermost chip package unit 1a and the second connecting pad 22 of the lowermost chip package unit 1a of the respective chip package units 1a to be exposed, as shown in FIG. 5 and FIG. 6. In the embodiment shown in FIG. 6, there are two upper openings 41 and two lower openings 42 but the number of both the upper opening 41 and the lower opening 42 is not limited.

Refer to FIG. 5 and FIG. 6, the respective chip package units 1a are electrically connected with the outside by the respective upper openings 41 and the respective lower openings 42 of the respective insulating layers 40.

Refer to FIG. 5 and FIG. 6, the lower opening 42 of the insulating layer 40 is further provided with a solder ball 50 by which the chip package unit 1a is electrically connected with the outside.

Refer to FIG. 6, the package structure 1 is electrically connected with a printed circuit board (PCB) 2 by the second connecting pad 22 in the lower opening 42, but not limited.

The present invention has the following advantages.

1. The front surface 10a or the back surface 10b of the chip 10 of the chip package unit 1a is electrically connected with the outside by the FPC board 20. Thereby the problem of increased manufacturing cost of the conventional chip package caused by arrangement of the through silicon via (TSV) can be solved effectively.

2. By the respective chip package units 1a stacked vertically, volume of chip package products is reduced and production process is simplified.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

The invention claimed is:

1. A chip package unit comprising:
a chip which includes a front surface provided with at least one die pad, a back surface opposite to the front surface, and a side surface located between the front surface and the back surface;
a flexible printed circuit (FPC) board which is mounted with a pre-designed circuit, bent to have a C-shaped section for clipping the chip therein, and provided with a first surface and a second surface opposite to the first surface; wherein the first surface is attached to the front surface, the side surface, and the back surface of the chip and provided with at least one first connecting pad corresponding to the at least one die pad of the chip so that the pre-designed circuit of the FPC board is able to be electrically connected with the at least one die pad by the at least one first connecting pads; wherein the second surface is provided with at least one second connecting pad and at least one third connecting pad which are respectively corresponding to the back surface and the front surface of the chip; wherein the at least one first connecting pad, the at least one second connecting pad, and the at least one third connecting pad of the FPC board are electrically connected with one another by the pre-designed circuit of the FPC board;
wherein the at least one die pad on the front surface of the chip is electrically connected with the at least one first connecting pad of the FPC board first and then further electrically connected with the outside by the at least one second connecting pad or the at least one third connecting pads of the FPC board.

2. The chip package unit as claimed in claim 1, wherein the chip package unit further includes a protective layer between the at least one die pad and the at least one first connecting pad.

3. A package structure formed by stacking chip package units comprising:
at least two chip package units each of which is as claimed in claim 1 and the at least two chip package units are stacking vertically and having an upper chip package unit and a lower chip package unit;
at least one connecting circuit arranged between the upper chip package unit and the lower chip package unit and electrically connected with the at least one second connecting pads of the upper chip package unit and the at least one third connecting pads of the lower chip package unit for allowing the upper chip package unit and the lower chip package unit to electrically connect with each other by the at least one connecting circuit; and
at least one insulating layer not only covering the chip package unit and the at least one connecting circuit but also filled into gaps of the package structure, and including at least one upper opening and at least one lower opening respectively used for allowing the at least one third connecting pad of the upper chip package units and the at least one second connecting pad of the lower chip package units to be exposed;
wherein the chip package units are electrically connected with the outside by the at least one upper opening and the at least one lower opening of the at least one insulating layer.

4. The package structure as claimed in claim 3, wherein the at least one lower opening of the at least one insulating layer is further provided with a solder ball by which the chip package unit is electrically connected with the outside.

5. The package structure as claimed in claim 3, wherein the package structure is electrically connected with a printed circuit board (PCB) by the at least one second connecting pad in the at least one lower opening.

6. A method of manufacturing chip package units comprising the steps of:
Step S1: providing a chip which includes a front surface provided with at least one die pad, a back surface opposite to the front surface, and a side surface located between the front surface and the back surface;
Step S2: providing a flexible printed circuit (FPC) board with a pre-designed circuit therein and having a first surface and a second surface opposite to the first surface; the first surface is provided with at least one first connecting pad corresponding to the at least one die pad of the chip while the second surface is provided with at least one second connecting pad and at least one third connecting pad; wherein the at least one first connecting pad, the at least one second connecting pad, and the at least one third connecting pad of the FPC board are electrically connected with one another by the circuit of the FPC board; and
Step S3: bending the FPC board to have a C-shaped section for clipping the chip therein; wherein the first surface is attached to the front surface, the side surface, and the back surface of the chip while the pre-designed circuit of the FPC board is electrically connected with the at least one die pad by the at least one first connecting pad; wherein the at least one second connecting pad is corresponding to the back surface of the chip; wherein the at least one third connecting pad is corresponding to the front surface of the chip; wherein the at least one die pad on the front surface of the chip is electrically connected with the at least one first connecting pad of the FPC board first and then further electrically connected with the outside by the at least one second connecting pad or the at least one third connecting pad of the FPC board; thereby the chip package unit is completed.

\* \* \* \* \*